(12) United States Patent
Renau et al.

(10) Patent No.: US 8,937,004 B2
(45) Date of Patent: Jan. 20, 2015

(54) APPARATUS AND METHOD FOR CONTROLLABLY IMPLANTING WORKPIECES

(71) Applicant: Varian Semiconductor Equipment Associates, Inc., Gloucester, MA (US)

(72) Inventors: Anthony Renau, West Newbury, MA (US); Ludovic Godet, Boston, MA (US); Timothy J. Miller, Ipswich, MA (US); Joseph C. Olson, Beverly, MA (US); Vikram Singh, North Andover, MA (US); James Buonodono, Amesbury, MA (US); Deepak A. Ramappa, Somerville, MA (US); Russell J. Low, Dellwood, MN (US); Atul Gupta, Beverly, MA (US); Kevin M. Daniels, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/866,315

(22) Filed: Apr. 19, 2013

(65) Prior Publication Data

US 2013/0234034 A1    Sep. 12, 2013

Related U.S. Application Data

(62) Division of application No. 12/947,078, filed on Nov. 16, 2010, now Pat. No. 8,461,030.

(60) Provisional application No. 61/261,983, filed on Nov. 17, 2009.

(51) Int. Cl.
*H01L 21/26* (2006.01)
*H01L 21/42* (2006.01)
(Continued)

(52) U.S. Cl.
CPC ........... *B01J 19/081* (2013.01); *H01J 37/3171* (2013.01); *H01J 37/32357* (2013.01);
(Continued)

(58) Field of Classification Search
None
See application file for complete search history.

(56) References Cited

U.S. PATENT DOCUMENTS

| 4,074,139 A | 2/1978 | Pankove |
| 6,203,862 B1 | 3/2001 | Bluck et al. |

(Continued)

FOREIGN PATENT DOCUMENTS

| DE | 2835136 A1 | 2/1980 |
| JP | 11288680 A | 10/1999 |

(Continued)

OTHER PUBLICATIONS

Kwok, One-step non-contact, patterns transferring by plasma based ion implantation, Journal of Physics D: Applied Physics, 41(2008), 225501, 5 pp, IOP Publishing, United Kingdom.

*Primary Examiner* — Fernando L Toledo
*Assistant Examiner* — Valerie N Newton

(57) ABSTRACT

A plasma processing apparatus comprises a plasma source configured to produce a plasma in a plasma chamber, such that the plasma contains ions for implantation into a workpiece. The apparatus also includes a focusing plate arrangement having an aperture arrangement configured to modify a shape of a plasma sheath of the plasma proximate the focusing plate such that ions exiting an aperture of the aperture arrangement define focused ions. The apparatus further includes a processing chamber containing a workpiece spaced from the focusing plate such that a stationary implant region of the focused ions at the workpiece is substantially narrower that the aperture. The apparatus is configured to create a plurality of patterned areas in the workpiece by scanning the workpiece during ion implantation.

13 Claims, 16 Drawing Sheets

(51) Int. Cl.
  *B01J 19/08* (2006.01)
  *H01J 37/317* (2006.01)
  *H01J 37/32* (2006.01)
  *H01L 31/0224* (2006.01)
  *H01L 31/068* (2012.01)
  *H01L 21/223* (2006.01)

(52) U.S. Cl.
  CPC ..... *H01J37/32422* (2013.01); *H01J 37/32623* (2013.01); *H01L 31/022425* (2013.01); *H01L 31/068* (2013.01); *H01L 31/0804* (2013.01); *H01J 2237/0453* (2013.01); *H01J 2237/1205* (2013.01); *H01L 21/2236* (2013.01); *Y02E 10/547* (2013.01)
  USPC .......................................................... 438/513

(56) References Cited

U.S. PATENT DOCUMENTS

| | | | |
|---|---|---|---|
| 6,552,259 | B1 | 4/2003 | Hosomi et al. |
| 7,727,866 | B2 | 6/2010 | Bateman et al. |
| 7,767,977 | B1 | 8/2010 | Godet et al. |
| 7,820,460 | B2 | 10/2010 | Sullivan et al. |
| 2005/0051517 | A1 | 3/2005 | Oehrlein et al. |
| 2007/0087574 | A1 | 4/2007 | Gupta et al. |
| 2009/0142875 | A1 | 6/2009 | Borden et al. |
| 2009/0308439 | A1 | 12/2009 | Adibi et al. |
| 2009/0308440 | A1 | 12/2009 | Adibi et al. |
| 2009/0309039 | A1 | 12/2009 | Adibi et al. |
| 2009/0317937 | A1 | 12/2009 | Gupta et al. |
| 2010/0255683 | A1 | 10/2010 | Godet et al. |
| 2010/0323508 | A1 | 12/2010 | Adibi et al. |
| 2011/0039367 | A1 | 2/2011 | Bateman et al. |
| 2011/0256698 | A1 | 10/2011 | Riordon et al. |

FOREIGN PATENT DOCUMENTS

| | | |
|---|---|---|
| JP | 2006196752 A | 7/2006 |
| JP | 2006278006 A | 10/2006 |
| WO | 0219377 A2 | 3/2002 |
| WO | 2010115110 A2 | 10/2010 |

$J(u)$ IS THE BEAM CURRENT DENSITY IN IONS/cm²/sec
=CURRENT/cm²/1.6E-19

$dt/dx$ IS THE RESIDENCE TIME FUNCTION IN SEC/CM
$=1/v(x)$ $D(x)$ IS THE FINAL PERIODIC DOSE IN IONS/cm²

$$D(x) = \sum_i \int J(u-x-ia)\frac{dt}{dx}du$$

i IS DETERMINED BY DIVIDING DESIRED DOSE BY THE DOSE IN EACH PULSE TAKING INTO ACCOUNT THE NUMBER OF SCANS
j = i *(HIGH DOSE/ LOW DOSE)

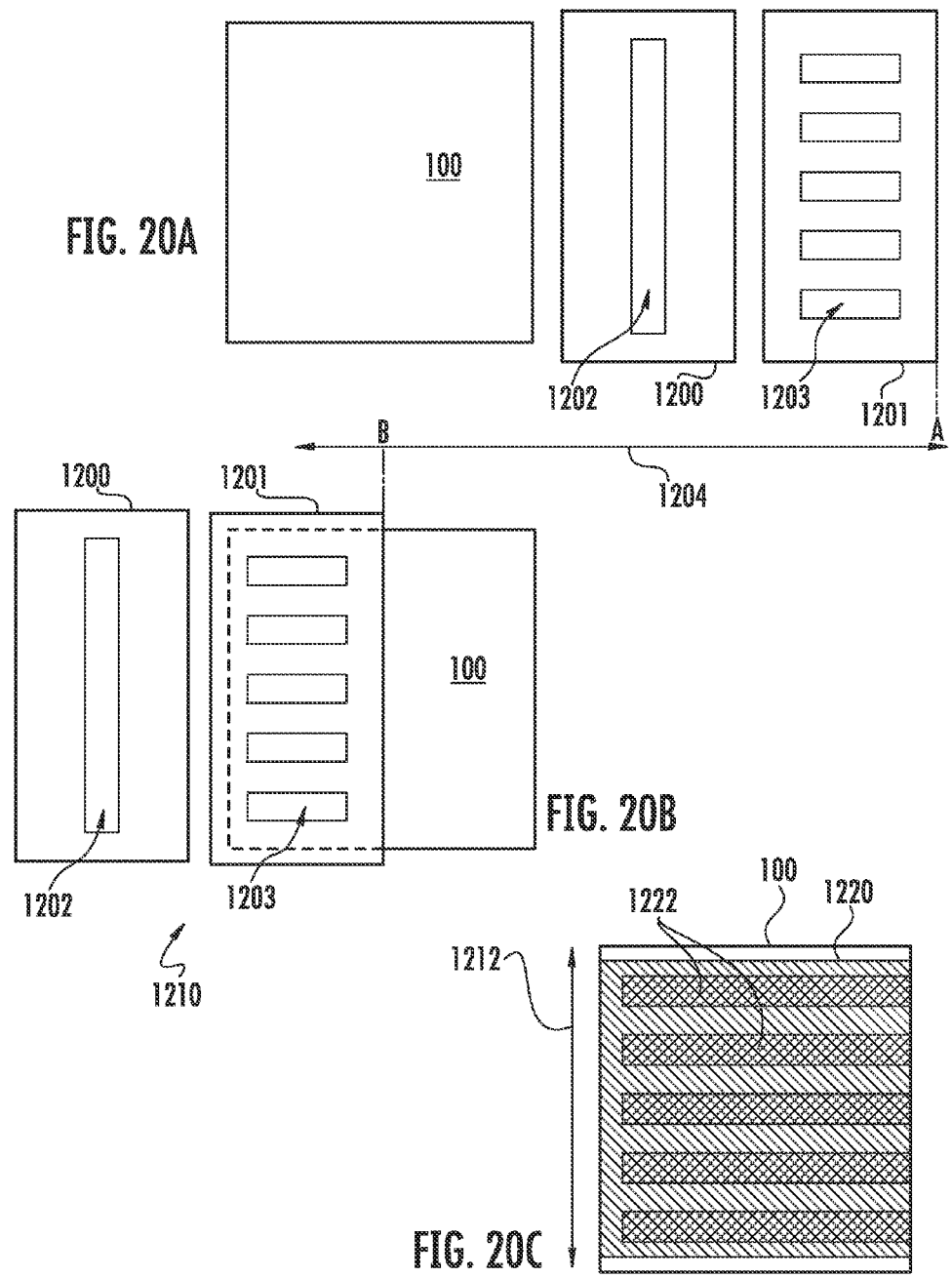

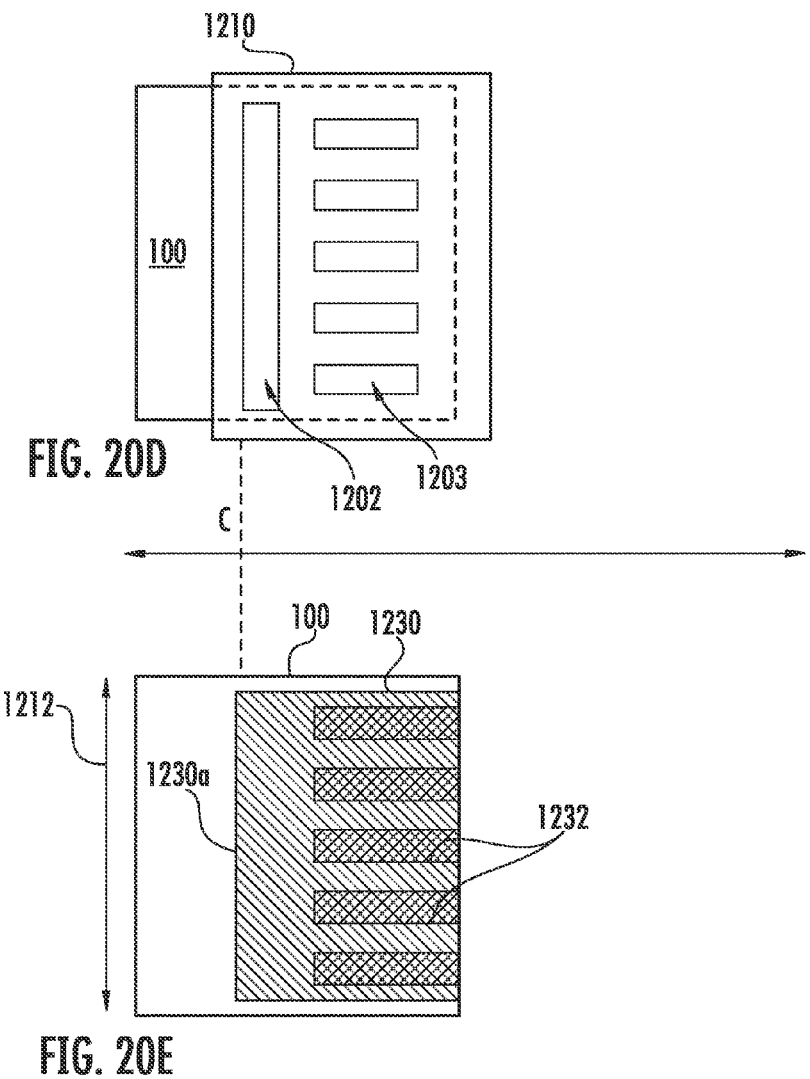

APPARATUS AND METHOD FOR CONTROLLABLY IMPLANTING WORKPIECES

This application is a divisional of U.S. patent application Ser. No. 12/947,078, filed Nov. 16, 2010, which claims the benefit of U.S. Provisional Patent Application No. 61/261,983, filed Nov. 17, 2009, which are incorporated by reference herein in their entirety.

FIELD

This invention relates to the implantation of workpieces and, more particularly, to a method and apparatus for focused implantation of workpieces.

BACKGROUND

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Doping may improve efficiency of solar cells. This doping may be performed using ion implantation. FIG. 1 is a cross-sectional view of a selective emitter solar cell 10. It may increase efficiency (the percentage of light converted to electrical energy) of a solar cell to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across. FIG. 2 is a cross-sectional view of an interdigitated back contact (IBC) solar cell 20. In the IBC solar cell 20, the junction is on the back of the solar cell. The doping pattern is alternating p-type and n-type dopant regions in this particular embodiment.

The p+ emitter 203 and the n+ back surface field 204 may be doped. This doping may enable the junction in the IBC solar cell to function or have increased efficiency.

High dose implantation may allow the lowest cost-of-ownership for an ion implanter. Localized or selective doping or localized or selective material modification may be required for some implants. The use of lithography with implantation may be too cost prohibitive for selective implants because of the extra steps required. Plasma doping technology is not fully tested for such applications. Direct exposure to neutrals in the plasma may cause deposition or etching of a workpiece and may require additional cleaning steps. Accordingly, there is a need in the art for an improved implantation of workpieces and, more particularly, to an improved method and apparatus for focused implantation of workpieces.

SUMMARY

In one embodiment, a processing apparatus comprises a plasma source configured to produce a plasma in a plasma chamber where the plasma contains ions for implantation into a workpiece. The apparatus also includes a focusing plate having an aperture configured to modify a shape of a plasma sheath proximate the focusing plate such that ions exit the aperture to define focused ions. The apparatus further includes a processing chamber containing a workpiece that is spaced from the focusing plate wherein the focused ions have an implant width that is substantially narrower than the aperture. The apparatus is configured to create a plurality of patterned areas in the workpiece by scanning the workpiece during ion implantation.

In another embodiment, a method of implanting a workpiece in a plasma processing system comprises providing a focusing plate adjacent to a plasma chamber containing a plasma, the focusing plate having an aperture arrangement configured to extract the ions from the plasma through at least one aperture that provides focused ions towards the workpiece. The method further comprises providing a bias between a workpiece holder and the plasma to attract the focused ions to the workpiece and scanning the workpiece holder with respect to the focusing plate so as to produce a plurality of selectively implanted areas.

BRIEF DESCRIPTION OF THE DRAWINGS

For a better understanding of the present disclosure, reference is made to the accompanying drawings, which are incorporated herein by reference and in which:

FIGS. 20a and 20b are a top view of a workpiece and focusing plate system before and after implantation, respectively;

FIG. 20c is a schematic top view of the workpiece of FIGS. 20a-b after implantation showing implanted areas;

FIG. 20d is a top view of a workpiece and focusing plate system during implantation;

FIG. 20e is a schematic top view of the workpiece of FIG. 20d showing implanted areas;

DETAILED DESCRIPTION

Embodiments of a system and workpieces are described herein in connection with solar cells. However, the embodiments of this system can be used with, for example, semiconductor wafers, compound semiconductor substrate or thin film, bit-patterned media, solid-state batteries, flat panels, LED substrates, glass substrates, etc. Thus, the invention is not limited to the specific embodiments described below.

Figure 3:
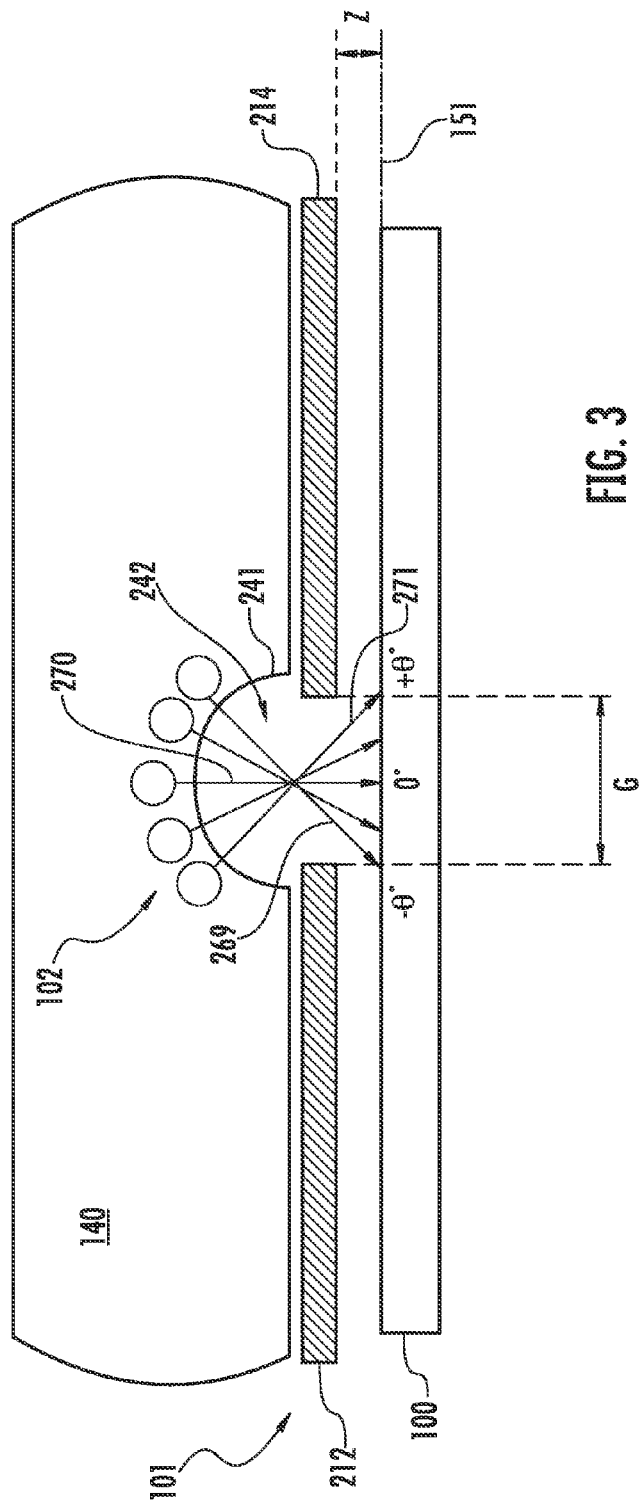
FIG. 3 is a cross-sectional view of a focusing plate arrangement within a plasma system.

FIG. 3 is a cross-sectional view of a focusing plate arrangement within a plasma system. The focusing plate 101 is configured to modify an electric field within the plasma sheath 242 to control a shape of a boundary 241 between plasma 140 and the plasma sheath 242. Accordingly, ions 102 that are attracted from the plasma 140 across the plasma sheath 242 may strike the workpiece 100 at a large range of incident angles.

The plasma 140 is generated as is known in the art. In the embodiment of FIG. 3, the focusing plate 101 includes a pair of panels 212 and 214 defining a gap there between having a horizontal spacing (G). The panels 212 may be an insulator, semiconductor, or conductor. In other embodiments, the focusing plate 101 may include only one panel or more than two panels. The pair of panels 212 and 214 may be a pair of sheets having a thin, flat shape. In other embodiments, the pair of panels 212 and 214 may be other shapes such as tube-shaped, wedge-shaped, and/or have a beveled edge proximate the gap. The pair of panels 212 and 214 also may be positioned at a vertical spacing (Z) above the plane 151 defined by the front surface of the workpiece 100. In one embodiment, the vertical spacing (Z) may be about 2.0 to 3.0 mm.

Ions 102 may be attracted from the plasma 140 across the plasma sheath 242 by different mechanisms. In one instance, the workpiece 100 is biased to attract ions 102 from the plasma 140 across the plasma sheath 242. The ions 102 may be a p-type dopant, an n-type dopant, hydrogen, a noble gas, or other species known to those skilled in the art.

Advantageously, the focusing plate 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the gap between the panels 212 and 214 at a large range of incident angles. For instance, ions following trajectory path 271 may strike the workpiece 100 at an angle of +θ° relative to the plane 151. Ions following trajectory path 270 may strike the workpiece 100 at about an angle of 0° relative to the same plane 151. Ions following trajectory path 269 may strike the workpiece 100 at an angle of −θ° relative to the plane 151. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (e) may be between +60° and −60° centered about 0°.

Figure 1:
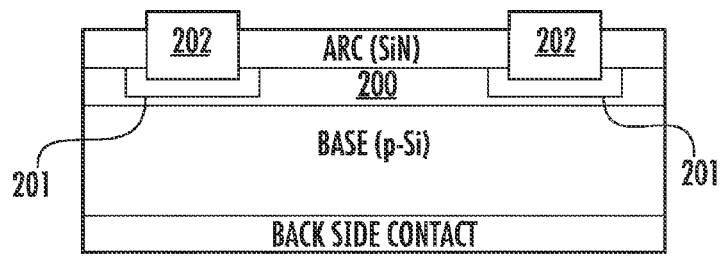
FIG. 1 is a cross-sectional view of a known selective emitter solar cell.
Figure 4:
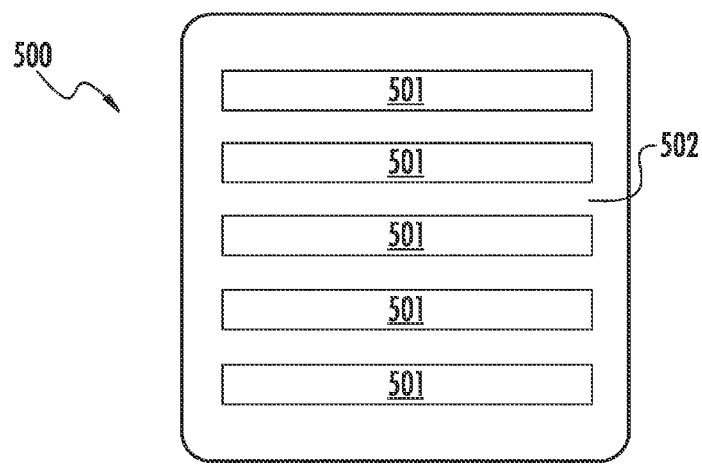
FIG. 4 is a top view of an embodiment of an implanted solar cell.

FIG. 4 is a top view of an embodiment of an implanted solar cell. The solar cell 500 of FIG. 4 is a selective emitter design, but the embodiments disclosed herein are not limited merely to selective emitter solar cells. The solar cell 500 may be, for example, approximately 156 mm or approximately 125 mm in width and height. As seen in FIG. 1 and, more particularly, FIG. 4, the solar cell 500 has contact regions 501 that are doped and an emitter 502 between the contact regions 501 doped at a slightly lower dose than the contact regions 501. In one instance, the contact regions are doped at approximately 5E15 dopant atoms/cm$^2$ and the emitter 502 is doped at approximately 1E15 dopant atoms/cm$^2$. In another instance, the contact regions 501 are approximately 2 mm apart and approximately 100 μm wide. These contact regions 501 are doped at approximately 3E15 and the emitter 502 is doped at approximately 1.5E15 using a 10 keV phosphorus implant. A blanket implant over the entire surface of the solar cell 500 may be performed to dope the emitter 502 while a selective or patterned implant may dope the contact regions 501.

Figure 5:
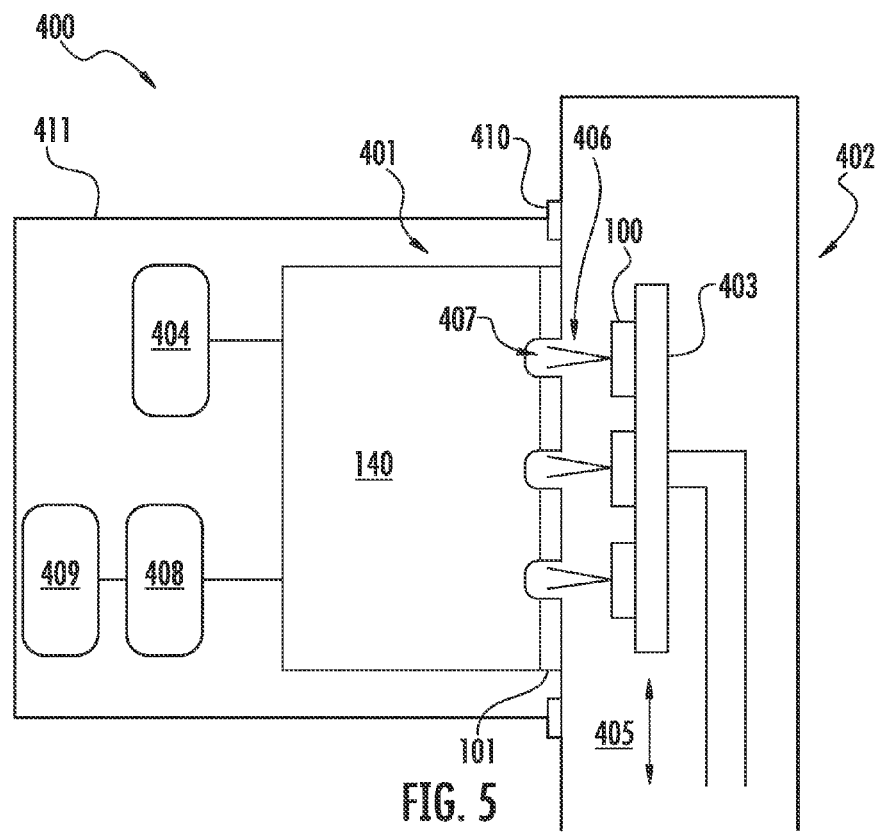
FIG. 5 is a block diagram of a plasma processing apparatus consistent with a first embodiment of the disclosure.

FIG. 5 is a block diagram of a processing apparatus consistent with a first embodiment of the disclosure. The system 400 includes a plasma source 401, a focusing plate 101 (or sheath engineering plate), and a process chamber 402. A gas source 404 is connected to the plasma source 401. The plasma source 401 or other components of the system 400 also may be connected to a pump (not shown), such as a turbopump. The plasma source 401 that generates the plasma 140 may be, for example, an RF plasma source, inductively-coupled plasma (ICP) source, indirectly heated cathode (IHC), or other plasma sources known to those skilled in the art. In this particular embodiment, the plasma source 401 is an RF plasma source with an RF source generator 408 and an RF source generator 409. The plasma source 401 is surrounded by an enclosure 411 and a DC break 410 separates the enclosure 411 from the process chamber 402 in this particular embodiment. The process chamber 402, plasma source 401, or platen 403 may be grounded.

The focusing plate 101 is used to extract ions 406 for implantation into a workpiece 100. The focusing plate 101 may be cooled. This extraction of the plasma 140 from the plasma source 401 may be continuous (DC) or pulsed. The plasma source 401 may be biased and a bias power supply (not shown) may be provided to provide a continuous or pulsed bias on the substrate to attract the ions 406.

The focusing plate 101 may have at least one aperture 407, though multiple apertures 407 are illustrated in FIG. 5. As discussed further below with respect to FIG. 20, the apertures 407 may be arranged in an array corresponding to the desired implant pattern within a workpiece 100. The focusing plate 101 may be cooled or otherwise have its thermal characteristics controlled. The pressure in the plasma source 401 and the process chamber 402 may be approximately equal, which may cause arcing. Individuals skilled in the art will recognize that high voltage arcing can be minimized by increasing the distance between objects at different electrical potentials and by employing smooth surfaces on components whenever possible. The dimensions of the implanted region in the workpiece 100 may vary with the parameters of components in the system 400.

One or more workpieces 100, which may be solar cells, are arranged on a platen 403 in the process chamber 402. The distance between the focusing plate 101 and the workpieces 100 may be controlled to compensate for any thermal expansion of the focusing plate 101. These workpieces 100 may be arranged in an array or matrix that is N workpieces 100 wide and N workpieces 100 long (where the "N" variable in the width dimension can be different from that in the length dimension). In FIG. 5, a matrix of 1×3 workpieces is illustrated. The platen 403, which is arranged in a vertical orientation, may use electrostatic clamping, mechanical clamping, or a combination of electrostatic and mechanical clamping to retain the workpieces 100. The workpieces 100 may be scanned using the platen 403. In the embodiment of FIG. 5, the platen 403 can scan in the direction 405. The platen 403, however, may perform either 1D or 2D scanning depending on the desired implant pattern on the workpieces 100. For example, 2D scanning may be performed to create spot-shaped or dot-shaped implant regions in the workpieces 100. In an alternate embodiment, the focusing plate 101 scans with respect to stationary workpieces 100. Various load and unload mechanisms may be used to place workpieces 100 on the platen 403. The platen 403 may be configured to provide backside gas cooling to the workpieces 100 in one instance. The workpiece 100 may be heated or cooled to various temperatures before or during implantation using the platen 403 or some other apparatus.

Pulsing of the plasma source 401 may be synchronized with the scanning of the focusing plate 101 and/or the workpieces 100. This scanning may be configured to achieve the desired dose and distribution of ions across the workpieces 100. The pulsed nature of the extraction to form the ions 406 may enable better charge neutralization of the workpiece 100. A secondary electron collector plate may be used in one instance.

Figure 6:
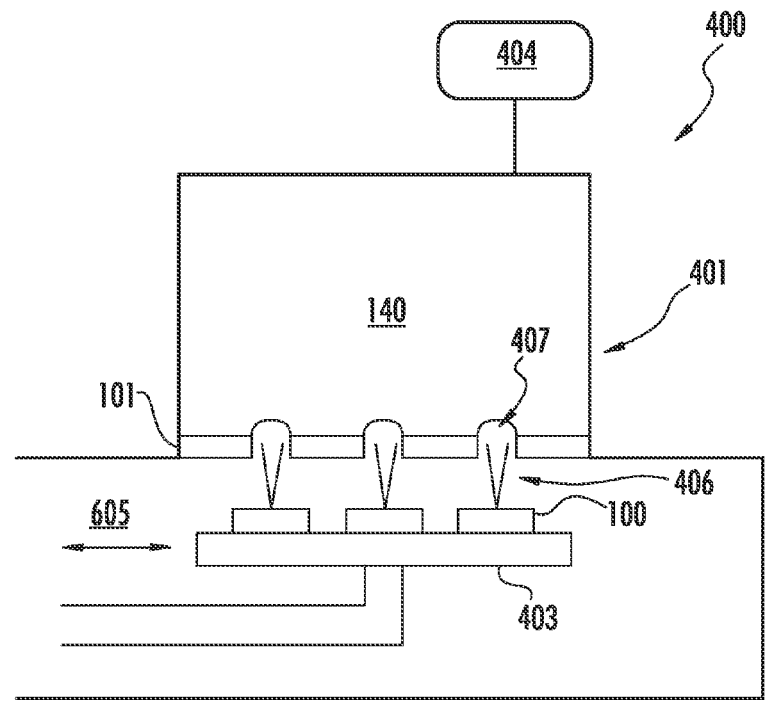
FIG. 6 is a block diagram of a plasma processing apparatus consistent with a second embodiment of the disclosure.

FIG. 6 is a block diagram of a plasma processing apparatus consistent with a second embodiment of the disclosure. In this embodiment, the platen 403 is disposed below the focusing plate 101 and moves in the direction 605. While the use of gravity to support workpieces 100 simplifies the platen 403, deposition or falling particles may occur on the workpieces.

Figure 7:
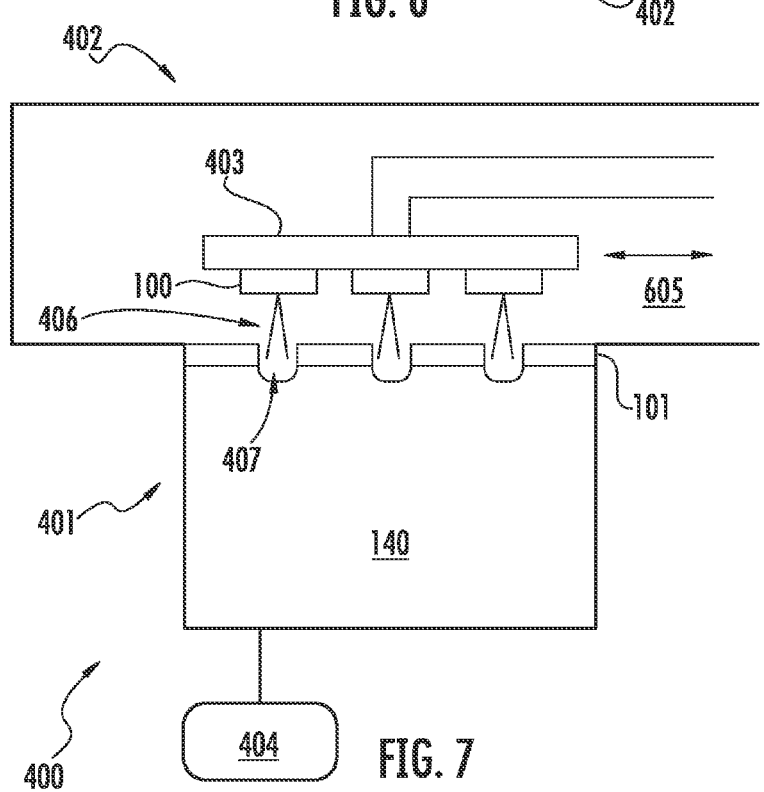
FIG. 7 is a block diagram of a plasma processing apparatus consistent with a third embodiment of the disclosure.

FIG. 7 is a block diagram of a plasma processing apparatus consistent with a third embodiment of the disclosure. In this embodiment, the platen 403 is disposed above the focusing plate 101 and moves in the direction 605. This eliminates the risk of deposition or particles on the workpieces 100, but the platen 403 needs adequate clamping force to hold the workpieces 100 upside-down during processing within the system 400.

Figure 8:
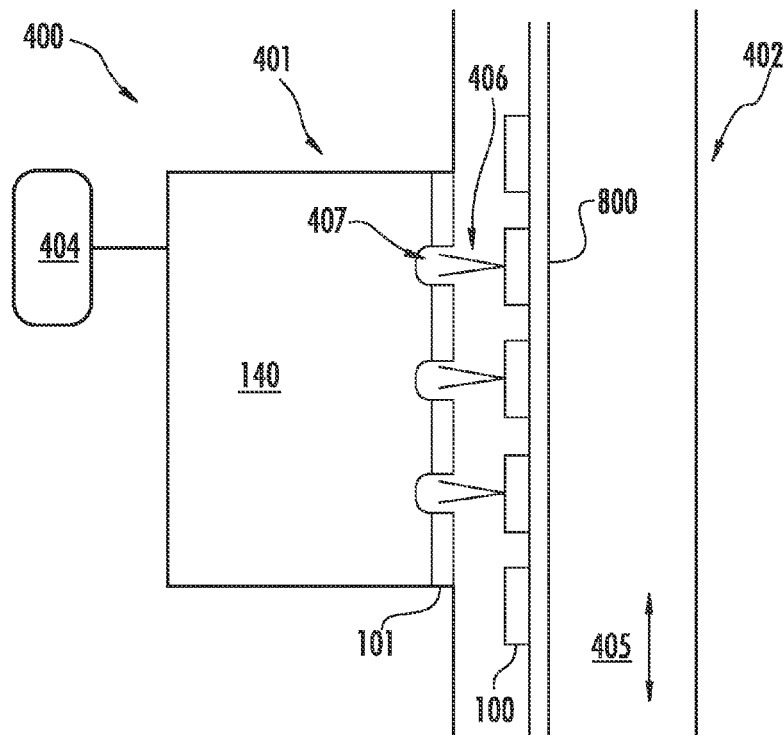
FIG. 8 is a block diagram of a plasma processing apparatus consistent with a fourth embodiment of the disclosure.

FIG. 8 is a block diagram of a plasma processing apparatus consistent with a fourth embodiment of the disclosure. The workpieces 100 in this embodiment are disposed on a conveyor belt 800 that moves in the direction 405, which may be a vertical direction.

Figure 9:
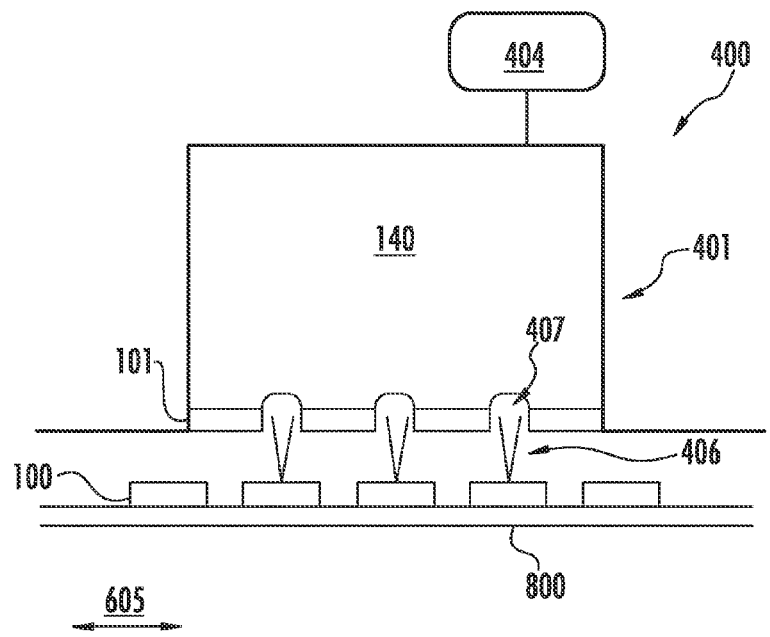
FIG. 9 is a block diagram of a plasma processing apparatus consistent with a fifth embodiment of the disclosure.

FIG. 9 is a block diagram of a plasma processing apparatus consistent with a fifth embodiment of the disclosure. The workpieces 100 are disposed on a conveyor belt 800 that moves in the direction 605, which may be a horizontal direction. This system 400 may have deposition or particles on the workpieces 100 similar to the embodiment of FIG. 6.

Figure 10:
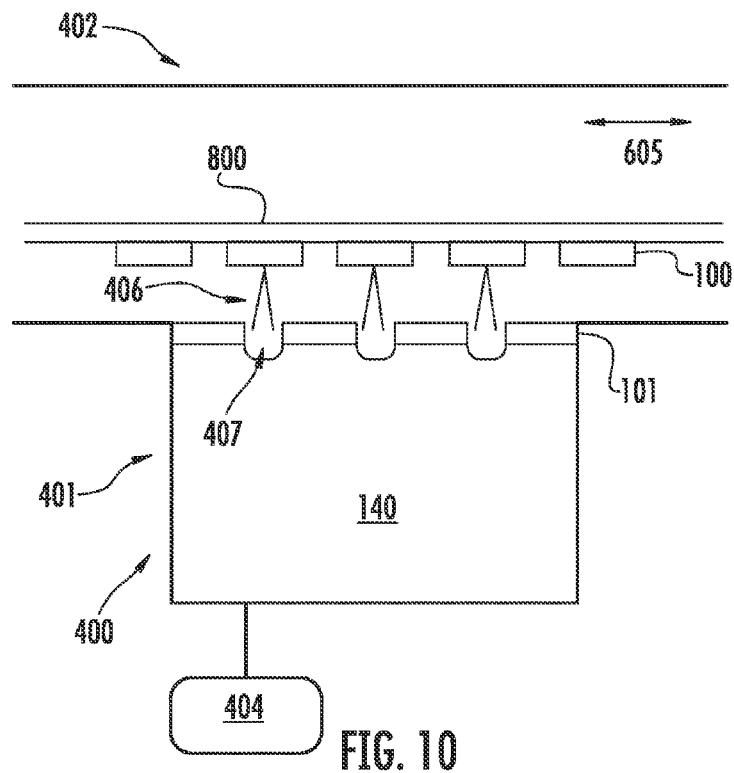
FIG. 10 is a block diagram of a plasma processing apparatus consistent with a sixth embodiment of the disclosure.

FIG. 10 is a block diagram of a plasma processing apparatus consistent with a sixth embodiment of the disclosure. The workpieces 100 are disposed on a conveyor belt 800 that moves in the direction 605. The conveyor belt 405 may grip the workpieces 100 so that the workpieces 100 are held upside-down. This embodiment eliminates the risk of deposition or particles on the workpieces 100.

While a conveyor belt 800 and platen 403 have been illustrated in, for example, the embodiments of FIGS. 5-10, other workpiece 100 transport mechanisms may be used. Thus, the embodiments disclosed herein are not limited solely to the conveyor belt 800 or platen 403. Certain embodiments using a conveyor belt 800 may use differential pumping to maintain a vacuum in the process chamber 402.

Figure 11:
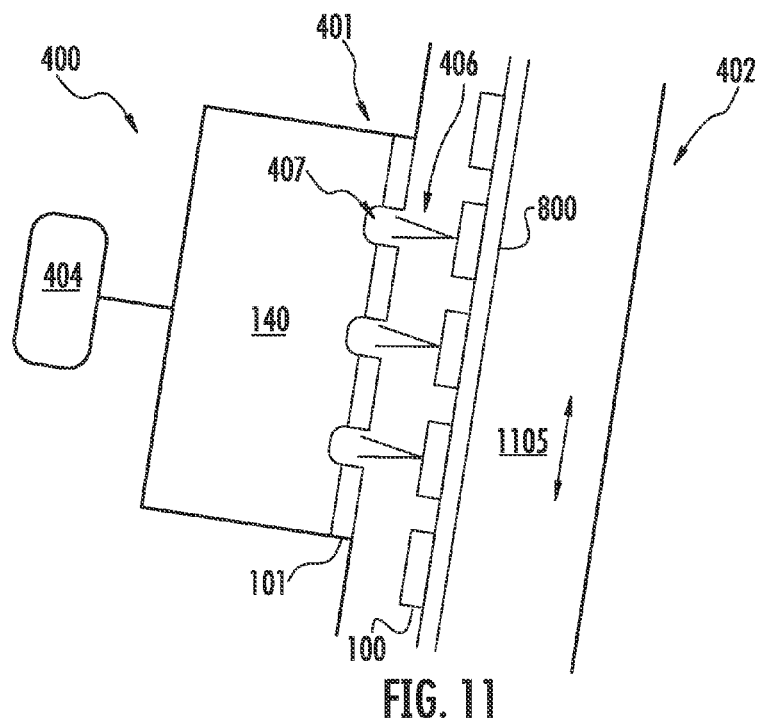
FIG. 11 is a block diagram of a plasma processing apparatus consistent with a seventh embodiment of the disclosure.

FIG. 11 is a block diagram of a plasma processing apparatus consistent with a seventh embodiment of the disclosure. In this embodiment, at least the conveyor belt 800 and the focusing plate 101 are angled and the workpieces 100 move in a direction 1105, which may be an angle in a range between horizontal and vertical. The rest of the system 400 may not be angled, though the entire system 400 of the embodiment of FIG. 11 is illustrated as angled. A conveyor belt 800 is illustrated, though a platen 403 or other workpiece 100 transport mechanism may be used. The angled configuration will allow gravity alignment of the workpieces 100 and simplify the mechanism holding the workpieces 100 on the conveyor belt 800.

Figure 2:
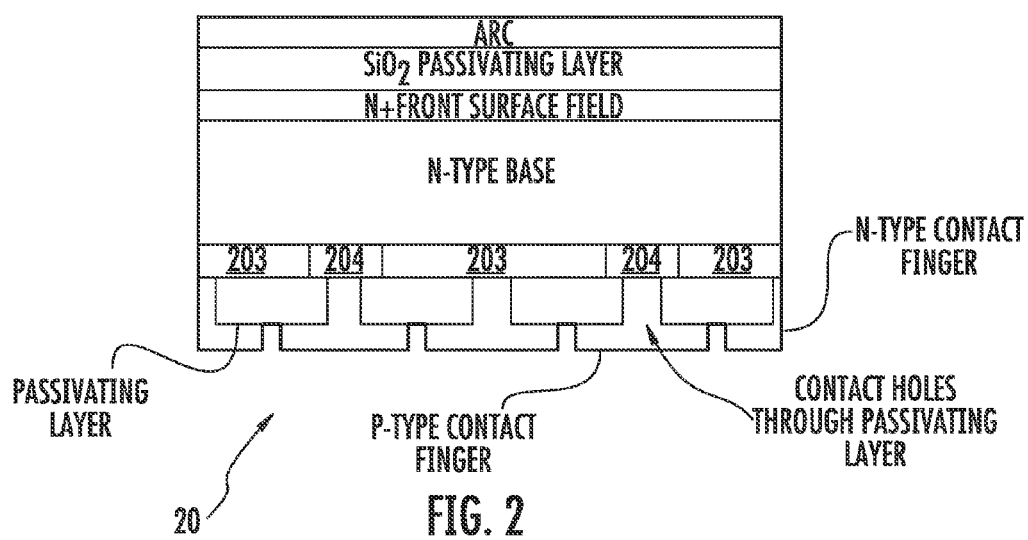
FIG. 2 is a cross-sectional view of a known interdigitated back contact solar cell.
Figure 12:
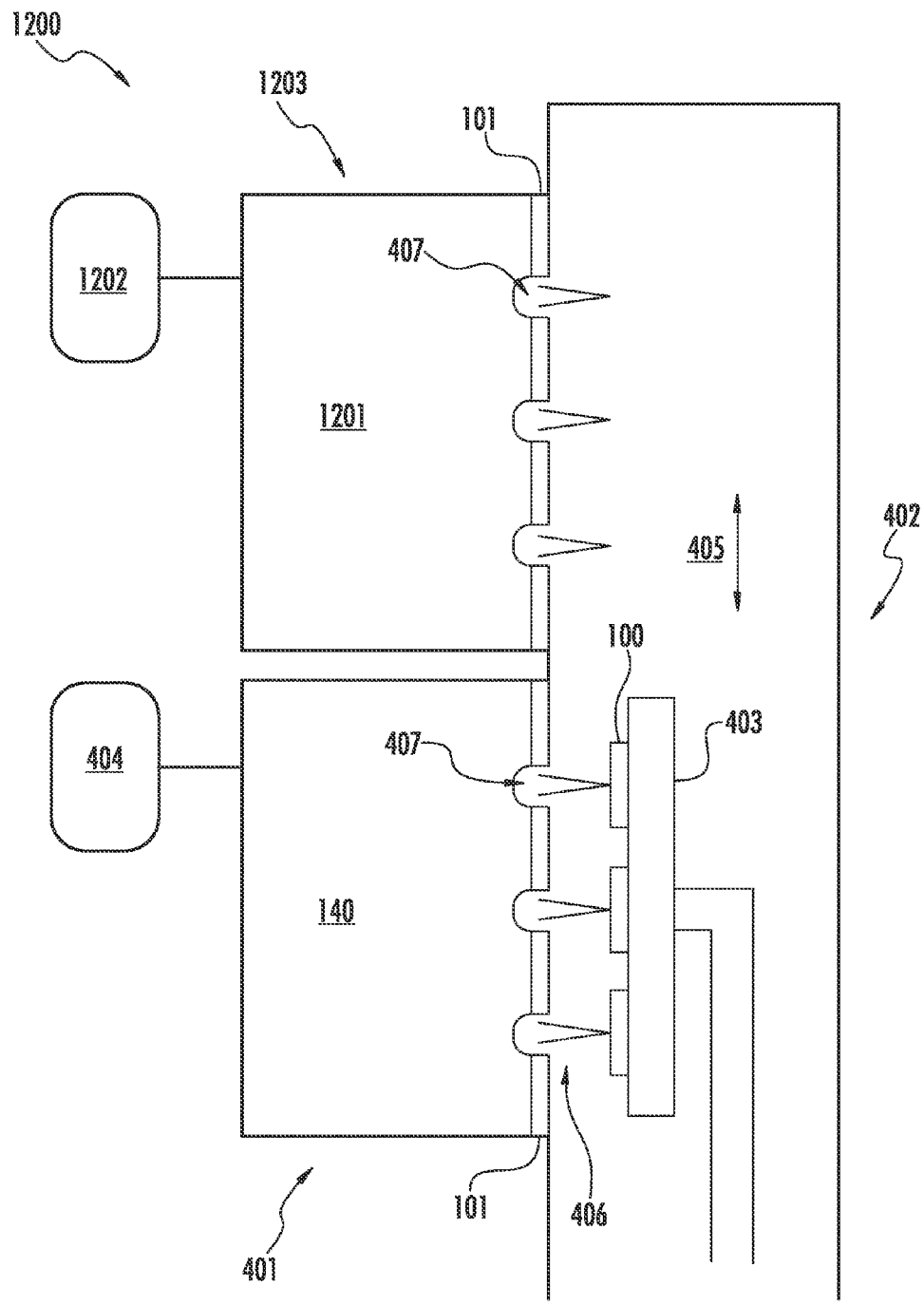
FIG. 12 is a block diagram of a plasma processing apparatus consistent with an eight embodiment of the disclosure.

FIG. 12 is a block diagram of a plasma processing apparatus consistent with an eighth embodiment of the disclosure. In the system 1200, a plasma source 401 and plasma source 1203 are illustrated. The plasma source 1203 forms a plasma 1201 from the gas source 1202. In one instance, the plasma 1201 is p-type, that is, a plasma that supplies p-type dopant species to workpieces 100, and the plasma 140 is n-type, that is, a plasma that supplies n-type dopant species to workpieces 100, though the plasma 140 and plasma 1201 are not limited to such an arrangement. In one particular embodiment, the system 1200 is used to make IBC solar cells as illustrated in FIG. 2. Thus, the platen 403 translates the workpieces 100 between the plasma source 401 and the plasma source 1203 to dope both the n-type and p-type regions of the IBC solar cell. The plasma sources 401, 1203 may be turned off and on during implant periods or may continuously operate with some counterdoping effects in the workpieces 100. The strength of bias may also be adjusted to minimized counterdoping effects. In other words, the bias between plasma and workpiece may be reduced when portions of the workpiece meant to be n-doped are exposed to plasma 1201 as well as when portions of the workpiece meant to be p-doped are exposed to plasma 140.

While a platen 403 is illustrated, a conveyor belt or other workpiece 100 transport mechanism may be used.

Figure 22:
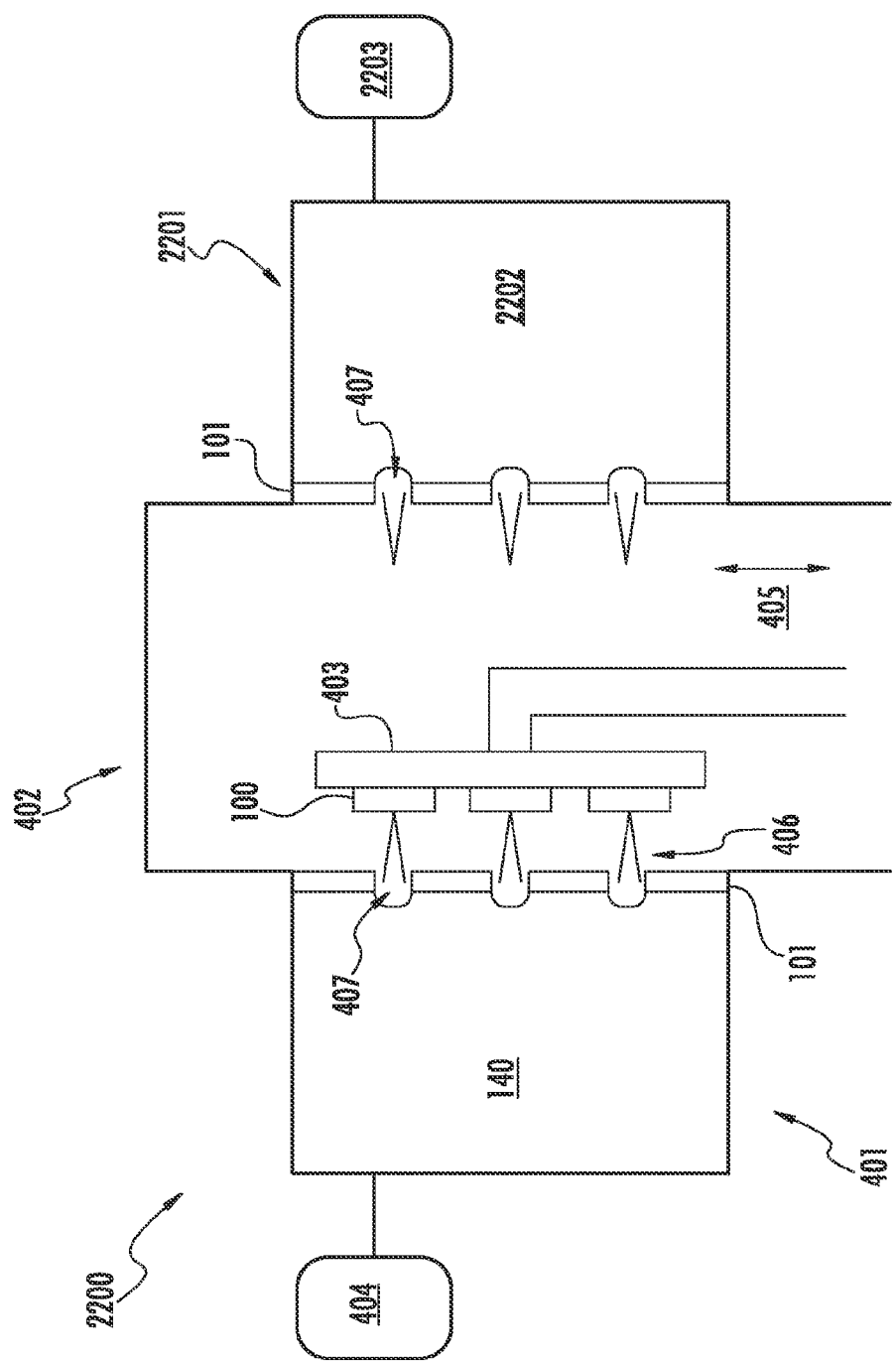
FIG. 22 is a block diagram of a plasma processing apparatus consistent with a ninth embodiment of the disclosure.

FIG. 22 is a block diagram of a plasma processing apparatus consistent with a ninth embodiment of the disclosure. The system 2200 has both a plasma source 401 and a plasma source 2201. The plasma source 2201 forms a plasma 2202 from a gas source 2203. While a platen 403 is illustrated, a conveyor belt or other workpiece 100 transport mechanism may be used. The platen 403 in this embodiment may rotate or twist between the plasma source 401 and the plasma source 2201. In another embodiment, the platen 403 or some other transport mechanism may allow implantation on two opposite sides of the workpieces 100. The plasma source 402 and plasma source 2201 may be at different elevations in another embodiment.

In the embodiments of FIGS. 12 and 22, two plasma sources are illustrated. More than two plasma sources also may be used. While the systems 1200 and 2200 are illustrated as vertical, other configurations similar to other embodiments disclosed herein are possible. Other systems with two plasma sources used for blanket and selective implants, doping and material modification implants, or other configurations are possible.

In the embodiments disclosed herein, the plasma source, such as the plasma source 401, may operate continuously. This reduces the time required to generate the plasma 140. The focusing plate 101 can be cleaned in-situ within the system 400. A cleaning plasma may be run in the plasma source 401 in one instance. This preventative maintenance may be performed, for example, after a certain number of implant cycles. This cleaning may maintain the desired characteristics or dimensions of the ions 406 over time when a species that can cause deposits is used in the plasma source 401. Thermal control of the focusing plate 101 may reduce deposits on the focusing plate 101. This may involve heating or cooling of the focusing plate.

Embodiments of the plasma processing apparatus of the present invention facilitate both selective small area and blanket implantation without the need for multiple masks or complex implantation schemes. To accomplish this, the aperture and workpiece configuration may be designed in conjunction with appropriate plasma parameters to facilitate extraction of focused ions that form an ion beam whose width converges and intercepts the substrate in a region whose width is substantially narrower (meaning less than about 75% of the aperture width) than the aperture from which it is formed.

Figure 13:
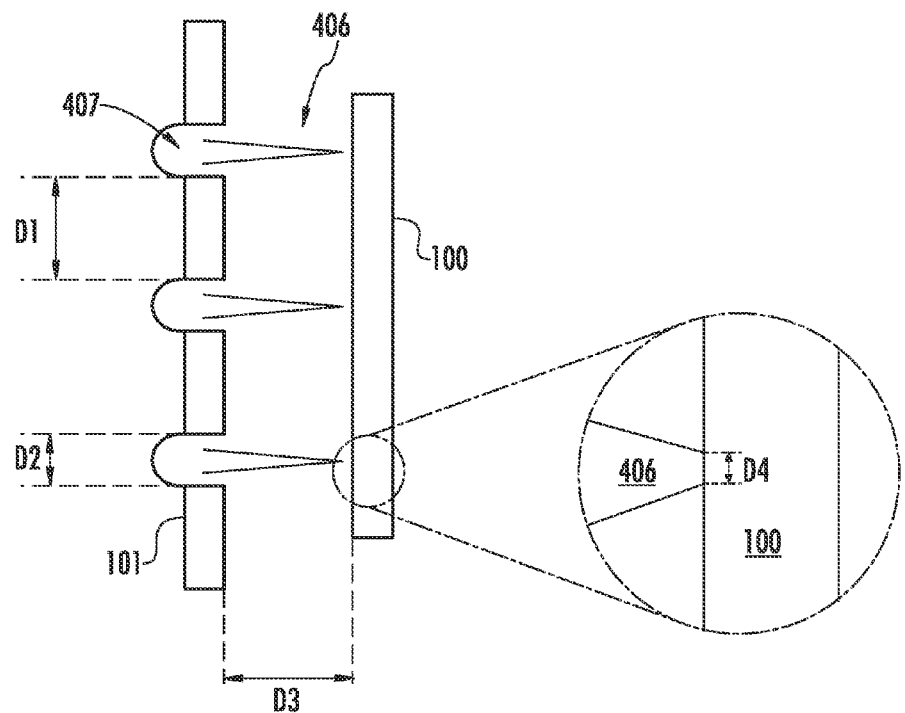
FIG. 13 is a cross-sectional diagram of one embodiment of a focusing plate.

FIG. 13 is a cross-sectional diagram of one embodiment of a focusing plate illustrating details of ion focusing. The focusing plate 101 may space the apertures 407 a distance D1 apart, which may be approximately 1 cm. The apertures 407 may be a length D2 of approximately 2 mm. The workpiece 100 may be spaced from the focusing plate 101 a distance D3 of approximately 1 cm. The implant region in the workpiece 100 using the focusing plate 101 may be a width D4 of approximately 100 µm. The focusing plate 101 may have apertures 407 that are greater than approximately 156 mm tall (going into the page in FIG. 13). The focusing plate 101 itself may be greater than 156 mm wide. Such a focusing plate 101 can extract ions 406 of approximately 0.2 A/m from each aperture 407 for a 10 keV implant and the ions 406 may be focused down to 100 µm implant width at the workpiece 100 if the workpiece 100 is spaced approximately 1 cm apart from the focusing plate 101. This is equivalent to 468 mA of ion 406 current over the workpiece 100 if there are 15 apertures 407. If the length D2 is approximately 1 mm and the plasma source is biased to 5 keV and the workpiece 100 is grounded, the ions 406 may be focused up to ten times or more. Accordingly, embodiments of this invention may be used to implant regions having a length D4 of about 10 µm. Other focusing levels are also possible.

Thus, embodiments of the invention may produce a stationary implant width (meaning width of an implant region produced without scanning the workpiece with respect to the focused ions) on the order of microns to hundreds of microns using an aperture whose width is on the order of millimeters. Narrow selectively implanted regions can therefore be formed whose width is the same or greater (using scanning) than the stationary implant width. Moreover, because the focused ions are extracted from a relatively larger aperture of width D2, the focused ions 406 provides a high flux (current) of ions over the stationary implant width D4 at the workpiece 100. This facilitates both high dose implantation in smaller areas, as well as rapid blanket implantation, by providing a high enough ion current to afford a reasonable workpiece scan rate for the required implantation levels of the blanket implantations.

Figure 14:
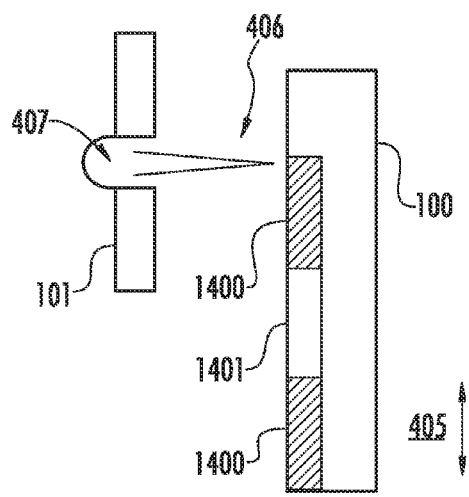
FIG. 14 is a cross-sectional diagram illustrating stepped movement during implantation.

FIG. 14 is a cross-sectional diagram illustrating stepped movement during implantation in accordance with a method of the invention. The workpiece 100 is moved with respect to the ions 406 in the direction 405. This forms higher-doped regions 1400 and lower-doped region 1401 in the workpiece 100. To form the higher-doped regions 1400, the workpiece 100 is scanned more slowly with respect to the plate 101 than during the implant of the lower-doped region 1401. Such a process may be repeated over the surface of the workpiece 100.

Figure 15A:
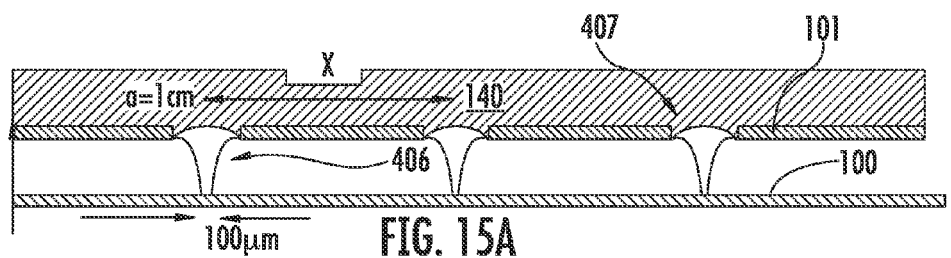
FIGS. 15*a*-15*d* illustrate the relationship between ion dose and scanning velocity.
Figure 15B:
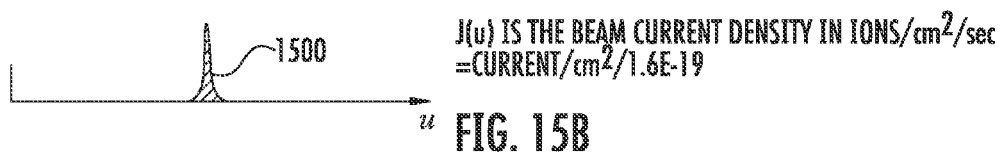

Turning to FIGS. 15*a*-15*d*, details are provided to illustrate the relationship between ion dose 1504 received in a substrate 100 and a variable scanning velocity, which may be provided between focus plate 101 and substrate 100. The variable scanning velocity (or rate) may be provided by scanning focus plate 101 with respect to a stationary substrate 100, scanning substrate 100 with respect to a stationary focus plate 101, or scanning both substrate and focus plate simultaneously. By changing the scanning velocity during implantation, regions of relatively higher and relatively lower implantation levels may be produced. In the embodiment depicted in FIGS. 15*a*-*d*, a variable scan rate is employed to produce a variable ion dose 1504 as a function of position along substrate 100 in the direction X. As depicted in FIG. 15*a*, ions are extracted from plasma 140 using focusing plate 101 to form a focused shape when the ions 406 impinge on substrate 100. When ions 406 implant into substrate 100, the current density of the ions 1500 at substrate 100 may be as shown in FIG. 15*b*. As depicted, the current density of ions extracted through 1 cm wide apertures 407 is narrowly peaked, in which the width of the ions may be about 100 µm when the ions impinge on substrate 100.

Figure 15C:
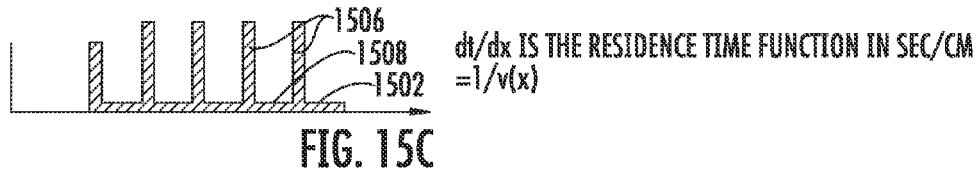
Figure 15D:
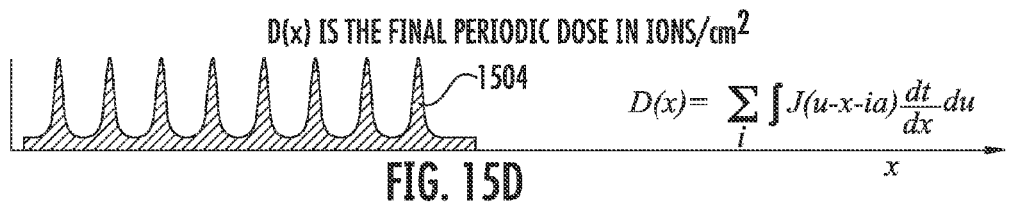

FIG. 15*c* depicts one scan rate sequence 1502 that may be used for focusing plate 101. In this embodiment, the scan rate sequence is shown as a residence time function (in sec/cm) such that the peaks 1506 in residence time function 1504 represent regions in which the scan rate is relatively slower and the base portions 1508 represent regions in which the scan rate is relatively faster. Thus, in the regions 1506 a higher ion dose is received because the focused ions 1500 are scanned relatively more slowly across the substrate 100 than in regions 1508. This variation between slow scan rate and fast scan rate may be repeated in a periodic fashion as shown in FIG. 15*c*, leading to the periodic variation in ion dose 1504 in the substrate 100, thus producing regions of relatively higher and lower ion doping in the X direction.

Embodiments of the present invention may also employ pulsed plasma implantation to vary the doping levels in different regions of a workpiece. In the case of pulsed DC or RF implantation, the pulse length or pulse frequency may be increased to form the higher-doped regions 1400 in alternate embodiments. In these alternate embodiments, the scan rate of workpiece 100 may be constant, while the pulse rate (or length) of a pulsed plasma is made relatively larger when the ions 406 are impinging on regions 1400 to be doped more heavily than regions 1401, which are exposed to a relatively shorter pulses or lesser pulse rate.

In embodiments of the invention, an apparatus such as that disclosed in FIG. 5, may be used to implant workpieces such that parameters associated with pulsed ion implantation processing may be varied according to the desired doping level. These parameters may include pulse duration, pulse frequency, and synchronization of source and substrate pulses. Examples of pulsing include applying a pulsed potential to the plasma or applying a pulsed potential to a workpiece.

Figure 18:
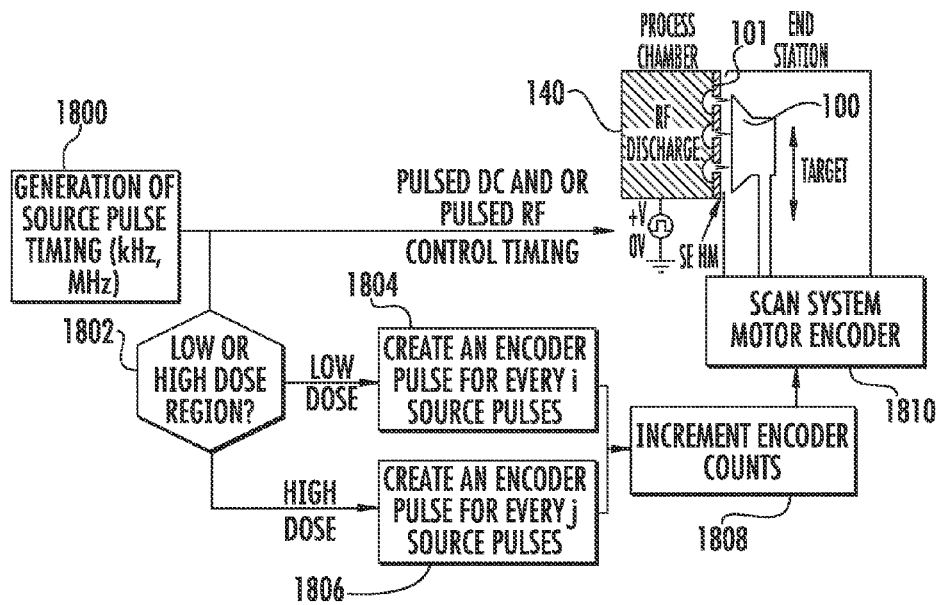
FIGS. 18-19 illustrate exemplary steps involved in embodiments of the invention that employ RF or DC synchronization to implant a workpiece with two dopant levels.
Figure 19:
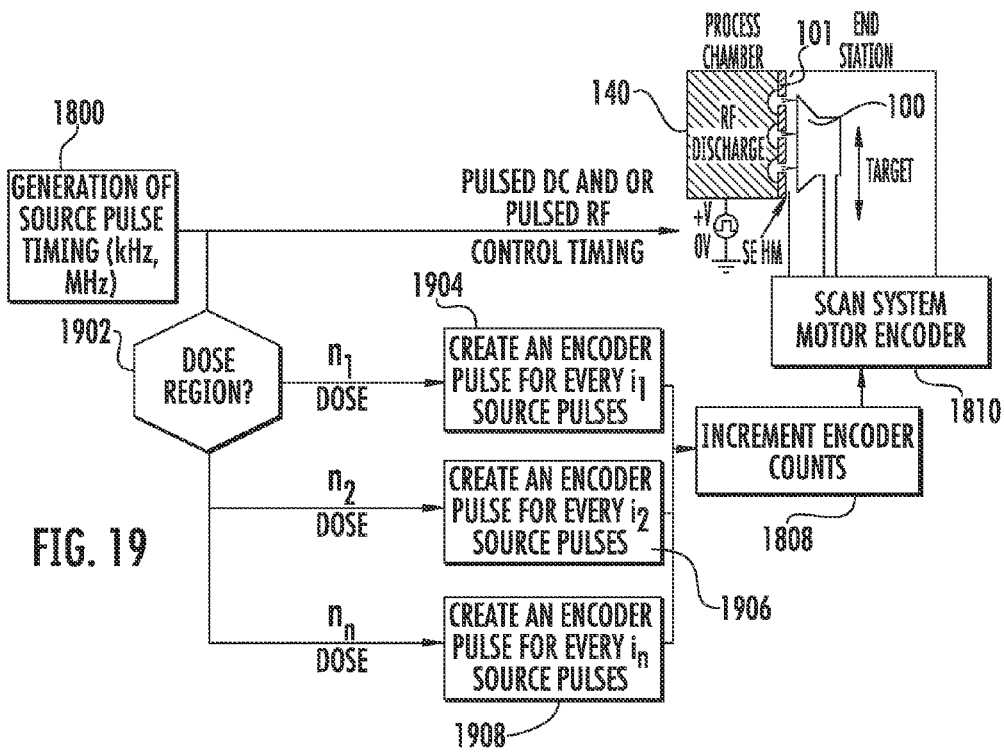

FIGS. 18-19 each illustrate exemplary steps involved in methods of the invention in which RF or DC synchronization is used to implant a workpiece with multiple different dopant levels. Of course, methods are possible other than those illustrated in FIGS. 18-19. In both methods, a target 1800 may be scanned with respect to an aperture plate, such as aperture plate 101, while a periodic implant pulse is generated. In accordance with the embodiments of FIGS. 18 and 19, during an "on" period of an implant pulse, a potential, such as a negative potential, may be applied between the workpiece and plasma such that positive ions from the plasma 140 accelerate through focusing plate 101 and onto workpiece 100.

In particular embodiments of the invention, the plasma 140 may be generated in a pulsed fashion by a plasma pulse source, in accordance with known techniques. In particular, the pulsed plasma may be generated using components (not shown) without the need to apply bias to workpiece 100. When desired, implant pulses may be periodically generated such that the implant pulses generally coincide with source pulses. Accordingly, when the implant pulses are generated, a plasma 140 is also "on," such that ions from plasma 140 are accelerated to the workpiece by the implant pulse and implant into workpiece 100. In order to achieve different dopant levels at different regions of a substrate, the implant pulses may be synchronized differently.

Turning in particular to FIG. 18, the method illustrated therein may be employed to create regions of two different doping levels in a workpiece corresponding to high dose and low dose regions. The method may be used to scan a target 100 with respect to an aperture plate 101, to create one or more relatively higher doping level regions and one or more relatively lower doping level regions in target (workpiece 100). At step 1800, a source pulse timing is generated. For example, a pulse generator coupled to an ion implantation system may generate a pulse every 100 µs having a duration $T_{ON}$ of 50 µs.

At step 1802, a decision is made as to whether a high ion dose or a low dose is to be applied to a given region. For example, the workpiece may be positioned at an initial point with respect to focus plate 101 in which low ion dose regions are intended to be formed using ions accelerated through its apertures. Accordingly, a program or set of instructions may be executed by a processor that correlates the current workpiece position with the desired low dose implantation to be applied.

At steps 1804 and 1806, a corresponding encoder pulse is created for every i or j pulses, corresponding to low or high ion dose levels. For example, for the low dose (1804) case, an encoder pulse may be generated every 2 source pulses, corresponding to every 200 µs, while for the high dose (1806) case, an encoder pulse may be generated every 20 source pulses corresponding to every 1000 µs.

In one embodiment the workpiece 100 may remain stationary until the motor encoder counts are incremented as shown in step 1808 and the scan system motor is sent a message to move as shown in step 1810. The workpiece may be stationary between encoder pulses and thus, the implantation into workpiece 100 in the low dose case consists of two source pulses while plasma 140 is on. This implantation recipe contrasts to the high dose case where the workpiece 100 is implanted for ten source pulses before moving. The higher dose region thus receives five times the dose of the lower dose region by virtue of being exposed to five times as many implantation pulses.

FIG. 19 depicts a method similar to that of FIG. 18, except that the method is used to apply synchronization to achieve any number of different doping levels for different regions on a workpiece. The method proceeds as at step 1800 and to step 1902 where the appropriate ion implantation dose corresponding to a region to be implanted is determined. Once this is determined, the method proceeds to one of the alternative steps (shown as 1904-1908) that correspond to the determined dose level to be implanted, such that the appropriate encoder pulse sequence is created. Again, the encoder pulse sequence may be applied as workpiece 100 is scanned until a desired area is implanted according to the desired doping level. As in FIG. 18, the method of FIG. 19 involves creating encoder pulses for every 1, 2, 3, etc. source pulses generated, according to the desired doping level.

In another embodiment, pulsing RF or pulsing DC may be used for dose control in the workpiece 100 as the workpiece 100 scans. This pulsing may be on the microsecond time scale. For instance, the pulse duration $T_{ON}$ may be adjusted from 50 µs to 49 µs in order to reduce the dose applied to the workpiece 100 by 2%.

In yet another embodiment, the workpiece 100 scans at a constant velocity in the direction 405 illustrated in FIG. 14, but the pulse duration or pulse rate is increased to form the higher-doped regions 1400. For example, a 5× longer pulse or 5× more frequent pulse rate compared to an implant for the lower-doped regions 1401 will produce 5× dose in the higher-doped regions 1400. Both RF and DC source pulsing may be used. This may be performed by either modifying the duty cycle of the RF source during a DC pulse or modifying the power level of the RF source during DC pulsing.

Figure 23:
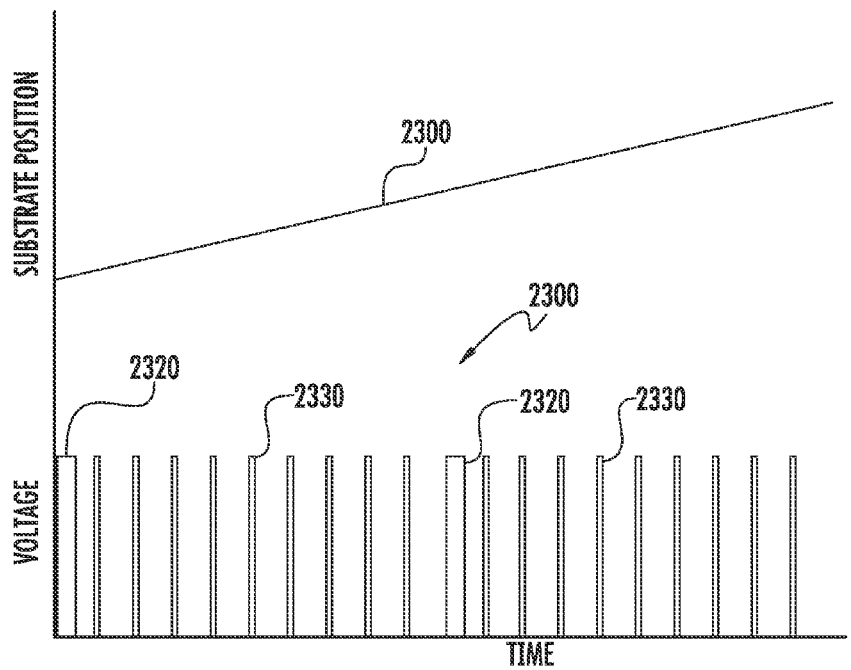
FIGS. 23-24 illustrate exemplary voltage and workpiece position curves as a function of time in accordance with pulsed implantation embodiments.
Figure 24:
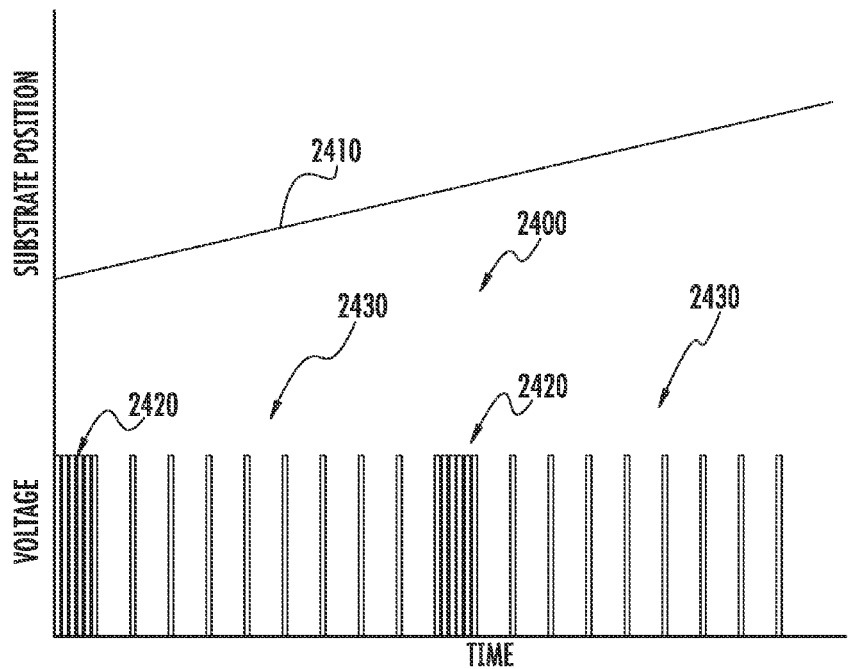

FIGS. 23 and 24 show exemplary voltage curves 2300 and 2400, respectively that may be applied in a pulsed implantation system as a function of time. The voltage pulses may represent implant pulses or source pulses, as described above. Also shown in FIGS. 23 and 24 are workpiece position curves 2310 and 2410, respectively, as a function of time. In FIG. 23, the workpiece moves at a constant velocity, but higher dose regions in the workpiece are created by a longer pulse duration, such as in pulses 2320. Lower dose regions in the workpiece are created by shorter pulse duration, such as pulses 2330.

In FIG. 24, the workpiece again moves at a constant velocity, illustrated by linear curve 2410. The higher dose regions 2420 in the workpiece are created by a higher pulse rate and lower dose regions 2430 are created by a lower pulse rate. In both the embodiments of FIGS. 23-24, the lower dose regions may be, for example, the region between the contacts in a solar cell and the higher dose regions may be, for example, the region under the contacts of a solar cell.

FIGS. 20a-c present a top view of a focusing plate system 1210 that is configured to perform both a blanket and selective implant. As illustrated in FIGS. 20a and 20b, a workpiece 100 is scanned in the direction 1204. The embodiment of the focusing plate system 1210 includes a first focusing plate 1200 with a first aperture 1202. The first aperture 1202 may perform a blanket implant across the width of the workpiece 100 (to function as a blanket aperture) by scanning, for example, in the direction 1204 to form blanket region 1220, as shown if FIG. 20c. The second focusing plate 1201 has second apertures 1203. These second apertures 1203 may perform a patterned or selective implant of the workpiece 100 by scanning the apertures 1203, for example, in the same direction 1204 to form patterned regions 1222. In this context scanning describes relative motion of the work piece 100 with respect to the apertures 1202 and 1203 and can be achieved by moving either or both of the workpiece 100 and the focusing plates 1200 and 1201. While two focusing plates are illustrated in the embodiment of FIGS. 20a-b, the present invention covers a single focusing plate that may have both a first aperture 1202 and second apertures 1203. In the example illustrated, both focusing plates 1200 and 1201 are scanned along the direction 1204 a distance equal to the distance between points A and B. FIG. 20b depicts the relative position of focusing plates 1200 and 1201 after the scanning is complete. The patterned regions 1222 may extend all the way to the edges of workpiece 100 by increasing the scan distance as desired. FIG. 20c illustrates details of the implantation geometry of workpiece 100 after scanning takes place for focusing plates having an initial position as in FIG. 20a and a final position as in FIG. 20b. Since, along the direction 1212 perpendicular to the scan direction 1204, the second apertures 1203 overlap with a portion of the first aperture 1202, the implanted regions 1222 that are exposed under the second apertures 1203 receive a higher ion dose.

In accordance with the invention, these blanket and selective implants may be at least partially simultaneous, as illustrated in FIGS. 20d-e. FIG. 20d depicts an embodiment of focusing plate system 1210 in which aperture 1202 and apertures 1203 are included in the same plate. As viewed in FIG. 20d, the focusing plate 1210 may be scanned from the left along direction 1204 to a position C. The configuration illustrated in FIG. 20d may represent a point during the middle of an implantation scan, after which plate 1210 continues to move to the left with respect to workpiece 100. FIG. 20e depicts the pattern of ion implantation produced by plate 1210 up to the point represented by FIG. 20d. Thus, a blanket region 1230 has been formed having a leading edge 1230a that corresponds to the leading edge of blanket focusing aperture 1202 at point C. As scanning continues, blanket region 1230 may extend across the entire workpiece 100 similar to the situation depicted in FIG. 20c. FIG. 20e also illustrates that selectively implanted regions 1232 are already at least partially formed using apertures 1203. Moreover, other arrangements of apertures in a focusing plate are possible, such as those that implant dots, spots, or other shapes. In this manner, the apertures may have a round, oval or any shape associated with a desired implant geometry.

Figure 21:
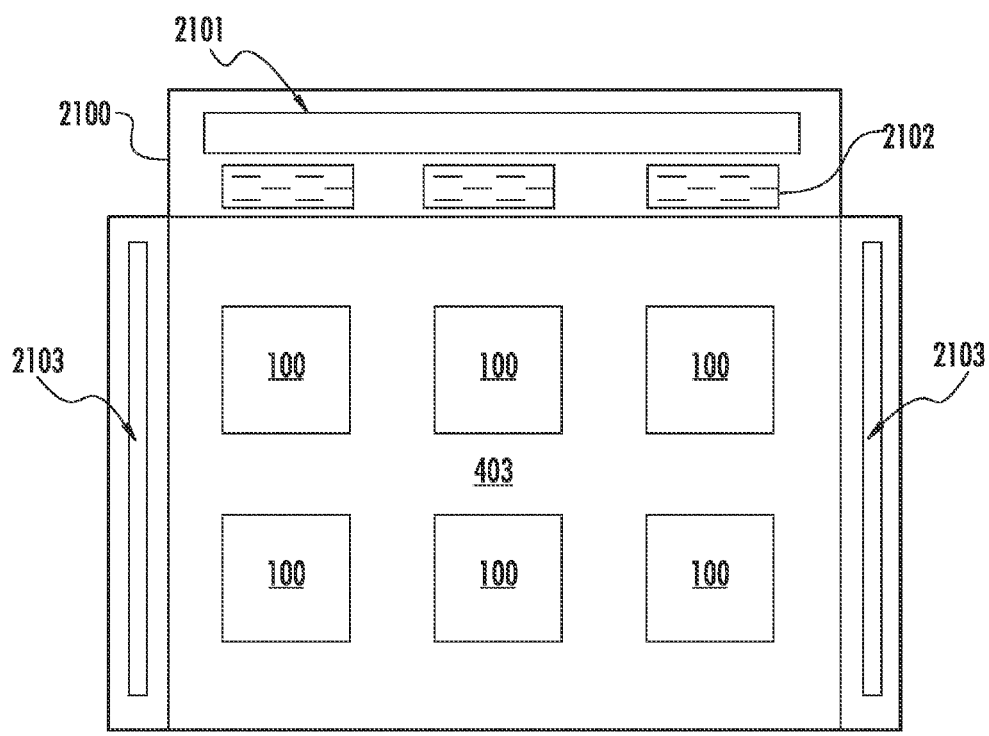
FIG. 21 is a front view of a process control apparatus.

FIG. 21 is a front perspective view of a process control apparatus. The process control apparatus 2100 is disposed on or near the platen 403 and the workpieces 100 in this embodiment. This process control apparatus 2100 may be configured to measure ion flux, the dimensions or spread of the ions leaving the focusing plate, the location of the ions, or how parallel the ions are with respect to the workpieces 100. The first aperture 2101 has a long dimension larger than the long dimension of the ions. A Faraday cup (not illustrated), which may be magnetically or electrically suppressed, is disposed behind the first aperture 2101 for total ion measurement. The region formed by the first aperture 2101 may be segmented to determine horizontal ion uniformity. The aperture arrays 2102 include columns of offset apertures. Each aperture in the aperture arrays 2102 is approximately 10 times smaller than the expected width of the ions. A Faraday cup (not illustrated), which may be magnetically or electrically suppressed, is disposed behind each aperture array 2102. Additional sets of arrays spaced about the horizontal direction give information about changes in width or parallelism. Regions of the process control apparatus 2100 may be coated with a material that increases luminescence when struck by an ion beam, which may be optically monitored. Second apertures 2103 may be disposed around the periphery of the platen 403 to provide real-time dose measurement and may be used for scan speed correction. A suppressed Faraday cup (not illustrated), which may be segmented, is disposed behind each second aperture 2103.

Figure 16:
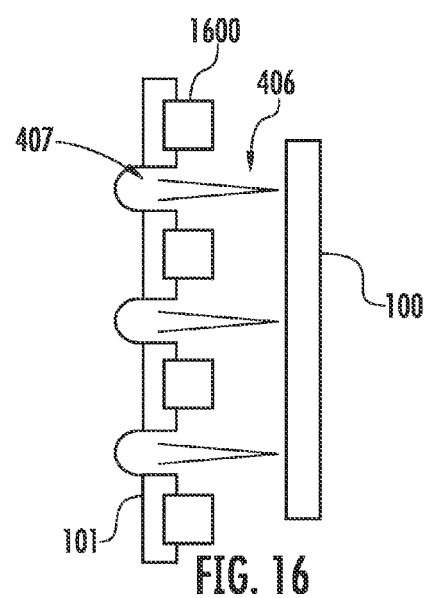
FIG. 16 is a cross-sectional diagram illustrating one embodiment of electrostatic suppression.
Figure 17A:
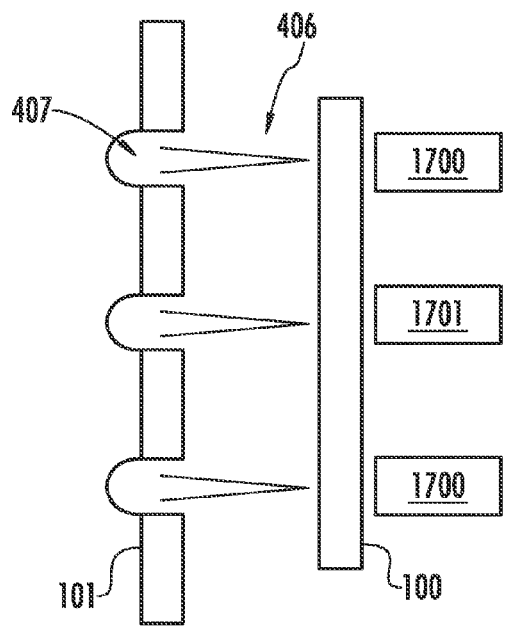
FIGS. 17A-B are a cross-sectional diagram illustrating two embodiments of magnetic suppression.
Figure 17B:
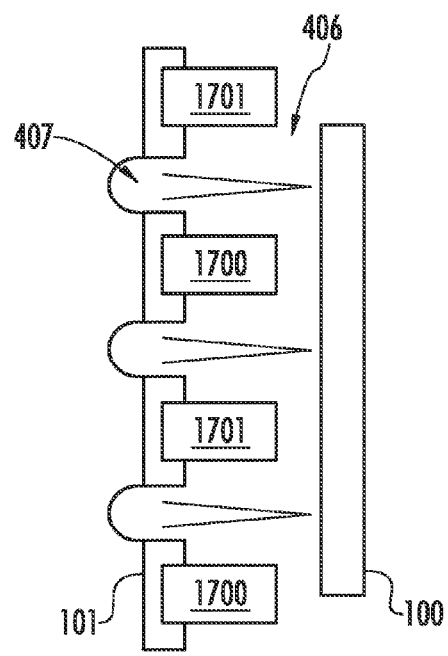

Secondary electrons may be generated using embodiments of this system. Charging of the workpiece 100 may affect the trajectories of the ions in the ions 406. The focus of the focusing plate 101 could be affected, etching of the focusing plate 101 may occur, and the heating of the focusing plate 101 could be increased due to secondary electrons. Secondary electrons may be suppressed by a mostly transparent electrode at a lower potential than the workpiece 100 or by magnets behind the workpiece 100. FIG. 16 is a cross-sectional diagram illustrating one embodiment of electrostatic suppression. At least one suppression plate 1600, which may be an insulator, conductor, or combination of insulating and conductive layers, is disposed on the focusing plate 101. FIGS. 17A-B are a cross-sectional diagram illustrating two embodiments of magnetic suppression. Magnets 1700, 1701, which may have opposite polarity, respectively, may be disposed behind the workpiece 100 (FIG. 17A) or between the focusing plate 101 and the workpiece 100 (FIG. 17B) to affect any secondary electrons. In FIG. 17A, the magnets 1700, 1701 may be stationary or movable with respect to the plasma source. In FIG. 17B, the magnets 1700, 1701 may be either disposed on or at least partially within the focusing plate 101. The magnets 1700, 1701 in FIG. 17B may be stationary, which simplifies operation.

Embodiments disclosed herein may be used to either dope or modify the crystal lattice of workpiece 100. In one instance, a hydrogen and/or helium implant is performed to enable cleaving of workpiece 100, which may involve a varying dose of hydrogen and/or helium across the workpiece 100. Other material modification, such as amorphization, also may be performed. Implantation using the embodiments disclosed herein may be applied to semiconductor or other applications.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of implanting a workpiece comprising:
providing a focusing plate, adjacent to a plasma chamber containing a plasma, configured to extract ions from the plasma through at least one aperture that provides focused ions toward the workpiece;
providing a bias between a workpiece holder and the plasma to attract the focused ions toward the workpiece, the workpiece being disposed on the workpiece holder; and
scanning the workpiece with respect to the focusing plate so as to produce a plurality of selectively implanted areas in the workpiece, wherein scanning the workpiece comprises scanning a first region of the workpiece at a first scan rate and scanning a second region of the workpiece at a second, higher scan rate.

2. The method of claim 1, wherein the aperture comprises a blanket aperture and the focusing plate further comprises a set of selective apertures, and wherein scanning the workpiece in a single scan produces both a blanket implantation of the workpiece at a first ion dose and selective implantation of a set of regions of the workpiece at a second, higher dose.

3. The method of claim 1 further comprising:
supplying source pulses to the plasma having a first pulse frequency;
providing, when an aperture of the focusing plate is positioned over a first region of the workpiece, a first set of bias pulses that have a first bias pulse frequency, wherein the first set of bias pulses are synchronized to the source pulses; and
providing, when the aperture of the focusing plate is positioned over a second region of the workpiece, a second set of bias pulses that have a second bias pulse frequency different from the first bias pulse frequency, wherein the second set of bias pulses are synchronized to the source pulses.

4. The method of claim 1, wherein scanning the workpiece comprises scanning a first region while pulses are applied to the plasma at a first pulse rate, and scanning a second region while pulses are applied to the plasma at a second, higher, pulse rate.

5. The method of claim 1, wherein scanning the workpiece comprises scanning a first region while pulses are applied to the plasma at a first pulse duration and scanning a second region while pulses are applied to the plasma at a second pulse duration.

6. A method of implanting a workpiece in a plasma processing system, comprising:
providing a first focusing plate adjacent to a first plasma chamber containing a first plasma having N-type dopant ions, the first focusing plate configured to extract ions from the plasma through at least one first aperture that provides focused ions towards the workpiece;
providing a second focusing plate adjacent to a second plasma chamber containing a second plasma having P-type dopant ions, the second focusing plate configured to extract ions from the plasma through at least one second aperture that provides focused ions towards the workpiece; and
scanning the workpiece with respect to the first and the second focusing plates while a bias is applied between the workpiece and the first and second plasmas, respectively, wherein a set of selectively N-doped areas and a separate set of selectively P-doped areas are formed in the workpiece, wherein scanning the workpiece comprises scanning a first region of the workpiece at a first scan rate and scanning a second region of the workpiece at a second, higher scan rate.

7. The method of claim 6, wherein the first and second plasma chambers are configured to turn the first and second plasmas off and on during implantation such that the P-type dopant ions only implant the P-doped areas and the N-type dopant ions implant the N-doped areas.

8. The method of claim 6, wherein a strength of the bias is adjusted such that the P-type dopant ions implant the P-doped areas more than the N-doped areas and the N-type dopant ions implant the N-doped areas more than the P-doped areas.

9. A method of implanting a workpiece comprising:
providing a focusing plate, adjacent to a plasma chamber containing a plasma, configured to extract ions from the plasma through at least one aperture that provides focused ions toward the workpiece;
providing a bias between a workpiece holder and the plasma to attract the focused ions toward the workpiece, the workpiece being disposed on the workpiece holder; and scanning the workpiece with respect to the focusing plate so as to produce a plurality of selectively implanted areas in the workpiece, wherein scanning the workpiece comprises scanning a first region while pulses are applied to the plasma at a first pulse rate, and scanning a second region while pulses are applied to the plasma at a second, higher, pulse rate.

10. The method of claim 9, wherein the aperture comprises a blanket aperture and the focusing plate further comprises a set of selective apertures, and wherein scanning the workpiece in a single scan produces both a blanket implantation of the workpiece at a first ion dose and selective implantation of a set of regions of the workpiece at a second, higher dose.

11. The method of claim 9, wherein scanning the workpiece comprises scanning a first region while pulses are applied to the plasma at a first pulse duration and scanning a second region while pulses are applied to the plasma at a second pulse duration.

12. A method for implanting a workpiece, comprising:
generating a plasma source configured to produce a plasma in a plasma chamber containing ions for implantation into a workpiece;
providing a focusing plate having a plurality of apertures configured to modify a shape of a plasma sheath proximate the focusing plate such that the ions exit the apertures to define focused ions; and
providing a processing chamber containing the workpiece that is spaced from the focusing plate wherein the focused ions have an implant width substantially narrower than the apertures; and
scanning the workpiece along a first direction, wherein the apertures comprise a set of selective apertures that each implant one of a plurality of patterned regions, and wherein the patterned regions are larger than the selective apertures due to the workpiece being scanned along the first direction.

13. The method of claim 12, wherein the plurality of apertures further comprises a blanket aperture that is wider than each of the selective apertures, the method further comprising:
producing a blanket implantation using the blanket aperture of a width of the workpiece when the workpiece is scanned along the first direction; and
performing the blanket implantation and implantation with the set of selective apertures at least partially simultaneously, wherein the patterned regions of the workpiece overlap with the width of the workpiece implanted by the blanket implantation.

* * * * *